United States Patent
Wang et al.

(10) Patent No.: US 10,523,104 B2
(45) Date of Patent: Dec. 31, 2019

(54) POWER TRANSISTOR BIAS CIRCUIT

(71) Applicant: Huawei Technologies Co., Ltd., Shenzhen (CN)

(72) Inventors: Xinyu Wang, Chengdu (CN); Qiang Xie, Shenzhen (CN); Liang Chen, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/434,603

(22) Filed: Jun. 7, 2019

(65) Prior Publication Data

US 2019/0288593 A1 Sep. 19, 2019

Related U.S. Application Data

(63) Continuation of application No. PCT/CN2017/099367, filed on Aug. 28, 2017.

(30) Foreign Application Priority Data

Dec. 29, 2016 (CN) .......................... 2016 1 1249750

(51) Int. Cl.
*H02M 3/158* (2006.01)
*H02M 1/088* (2006.01)
*H03K 17/10* (2006.01)

(52) U.S. Cl.
CPC .......... *H02M 1/088* (2013.01); *H02M 3/158* (2013.01); *H03K 17/102* (2013.01)

(58) Field of Classification Search
CPC ...... H02M 1/088; H02M 3/155; H02M 3/156; H02M 3/157; H02M 3/158; H03K 17/102
See application file for complete search history.

(56) References Cited

U.S. PATENT DOCUMENTS 6,703,893 B1  3/2004  Isham
8,072,242 B2 * 12/2011  Barbier .......... H03K 19/018585
                                                      326/115

(Continued)

FOREIGN PATENT DOCUMENTS

CN         1714496 A      12/2005
CN       104184460 A      12/2014

(Continued)

OTHER PUBLICATIONS

Machine Translation and Abstract of Chinese Publication No. CN104184460, Dec. 3, 2014, 28 pages.

(Continued)

*Primary Examiner* — Adolf D Berhane
(74) *Attorney, Agent, or Firm* — Conley Rose, P.C.

(57) ABSTRACT

A direct current-direct current (DC-DC) converter includes an upper transistor, a lower transistor, a first bias circuit and a second bias circuit. A first input end of the first bias circuit is coupled to a first voltage reference, a second input end of the first bias circuit is coupled to a power source (PVDD), and an output end of the first bias circuit is coupled to a gate of the upper transistor to provide a first bias voltage for the gate of the upper transistor. A first input end of the second bias circuit is coupled to a second voltage reference, a second input end of the second bias circuit is coupled to a power ground (PGND), and an output end of the second bias circuit is coupled to a gate of the lower transistor to provide a second bias voltage for the gate of the lower transistor.

18 Claims, 3 Drawing Sheets

(56) References Cited

U.S. PATENT DOCUMENTS

| | | | |
|---|---|---|---|
| 8,310,283 B2* | 11/2012 | Chen | H03K 17/08122 326/83 |
| 8,482,319 B1 | 7/2013 | Zhang | |
| 2003/0122606 A1* | 7/2003 | Ajit | H03K 17/0822 327/309 |
| 2004/0119526 A1* | 6/2004 | Ajit | H03K 19/00315 327/536 |
| 2007/0024325 A1* | 2/2007 | Chen | G11C 7/04 327/55 |
| 2007/0064953 A1* | 3/2007 | Ishida | H03F 1/52 381/55 |
| 2011/0102070 A1 | 5/2011 | Chen et al. | |
| 2011/0148465 A1 | 6/2011 | Barbier | |
| 2012/0200338 A1 | 8/2012 | Olson | |
| 2014/0292379 A1 | 10/2014 | Itonaga | |
| 2015/0171794 A1* | 6/2015 | Takahashi | H03F 1/223 330/296 |
| 2015/0244322 A1* | 8/2015 | Hur | H03F 1/0211 330/296 |
| 2016/0181988 A1* | 6/2016 | Du | H03G 3/348 330/296 |
| 2019/0287576 A1* | 9/2019 | Tanaka | G05F 3/262 |

FOREIGN PATENT DOCUMENTS

| | | |
|---|---|---|
| CN | 105871180 A | 8/2016 |
| CN | 106817016 A | 6/2017 |
| WO | 2007066278 A1 | 6/2007 |

OTHER PUBLICATIONS

Machine Translation and Abstract of Chinese Publication No. CN105871180, Aug. 17, 2016, 11 pages.

Machine Translation and Abstract of Chinese Publication No. CN106817016, Jun. 9, 2017, 17 pages.

Foreign Communication From a Counterpart Application, Chinese Application No. 201611249750.8, Chinese Office Action dated Aug. 16, 2018, 6 pages.

Foreign Communication From a Counterpart Application, PCT Application No. PCT/CN2017/099367, English Translation of International Search Report dated Nov. 30, 2017, 2 pages.

Hazucha, P., et al., "High Voltage Tolerant Linear Regulator With Fast Digital Control for Biasing of Integrated DC-DC Converters," XP011152700, IEEE Journal of Solid-State Circuits, IEEE Service Center, Piscataway, NJ, USA, vol. 42, No. 1, Jan. 1, 2007, pp. 66-73.

Nam, H., et al., "5-V Buck Converter Using 3 .3-V Standard CMOS Process With Adaptive Power Transistor Driver Increasing Efficiency and Maximum Load Capacity," XP011470067, IEEE Transactions on Power Electronics, Institute of Electrical and Electronics Engineers, USA, vol. 27, No. 1, Jan. 1, 2012, pp. 463-471.

Foreign Communication From a Counterpart Application, European Application No. 17888799.8, Extended European Search Report dated Oct. 15, 2019, 12 pages.

* cited by examiner

POWER TRANSISTOR BIAS CIRCUIT

CROSS-REFERENCE TO RELATED APPLICATIONS

This application is a continuation of International Patent Application No. PCT/CN2017/099367 filed on Aug. 28, 2017, which claims priority to Chinese Patent Application No. 201611249750.8 filed on Dec. 29, 2016. The disclosures of the aforementioned applications are hereby incorporated by reference in their entireties.

TECHNICAL FIELD

The present disclosure relates to the field of electronic technologies, and in particular, to a power transistor bias circuit.

BACKGROUND

A power transistor may usually be responsible for final output in a power circuit to implement power output. In a high frequency scenario, a direct current-direct current (DC-DC) converter may implement high efficiency output using a stacked power transistor.

Referring to FIG. 1, FIG. 1 is a schematic diagram of a power transistor bias circuit based on a stacked power transistor. As shown in FIG. 1, the stacked power transistor circuit may include a P-type Metal Oxide Semiconductor (MOS) transistor MP 1, a P-type MOS transistor MP 2, an N-type MOS transistor MN 1, an N-type MOS transistor MN 2, a ½ power rail bidirectional voltage regulator, a P-type field effect transistor driver module, an N-type field effect transistor driver module, a capacitor 1, and a capacitor 2. A source of the MP 1 is connected to a power source (Power Voltage Device (PVDD)). A drain of the MP 1 is connected to a source (for example, a VPCAS node) of the MP 2. A drain of the MP 2 is connected to a drain (for example, an LX node) of the MN 2. A source of the MN 2 is connected to a drain (for example, a VNCAS node) of the MN 1. A source of the MN 1 is connected to a power ground (PGND). The P-type field effect transistor driver module is connected to a gate of the MP 1, and the N-type field effect transistor driver module is connected to a gate of the MN 1. A Pulse Width Modulation (PWM) controller is configured to control the P-type field effect transistor driver module to input a drive signal PG to the gate of the MP 1, and control the N-type field effect transistor driver module to input a drive signal NG to the gate of the MN 1. The ½ power rail bidirectional voltage regulator is configured to input a bias voltage VMID=½ (PVDD+PGND) to a gate of the MP 2 and a gate of the MN 2 based on a power voltage of the PVDD and a power ground voltage of the PGND, and use the bias voltage as a power domain voltage of the P-type field effect transistor driver module and the N-type field effect transistor driver module. In a high-frequency DC-DC converter, the bias voltage may be used to improve parameters such as stability of a control loop and reliability of the power transistor.

However, an existing problem is that in the circuit shown in FIG. 1, the ½ power rail bidirectional voltage regulator provides a same bias voltage for both the gate of the MP 2 and the gate of the MN 2. Therefore, a switch action of a switching transistor of an upper transistor (MP 1) not only affects a value of the bias voltage input to the gate of the MP 2 but also affects the bias voltage input to the gate of the MN 2. Similarly, a switch action of a switching transistor of a lower transistor (MN 1) not only affects a value of the bias voltage input to the gate of the MN 2, but also affects the bias voltage input to the gate of the MP 2.

SUMMARY

Embodiments of the present disclosure provide a power transistor bias circuit in order to reduce impact of a switch action of a power transistor on a bias voltage of the power transistor, and improve stability of a control loop and reliability of the power transistor.

To achieve the foregoing objectives, the following technical solutions are used in the embodiments of the present disclosure.

According to a first aspect of the embodiments of the present disclosure, a power transistor bias circuit is provided. The power transistor bias circuit includes a first P-type field effect transistor, a second P-type field effect transistor, a P-type field effect transistor driver module, a first voltage stabilization capacitor, a first bias module, a first N-type field effect transistor, a second N-type field effect transistor, an N-type field effect transistor driver module, a second voltage stabilization capacitor, a second bias module, and a PWM controller.

A first output end of the PWM controller is connected to a first input end of the P-type field effect transistor driver module, a second input end of the P-type field effect transistor driver module is connected to a PVDD, an output end of the P-type field effect transistor driver module is connected to a gate of the first P-type field effect transistor, a source of the first P-type field effect transistor is connected to the PVDD, a drain of the first P-type field effect transistor is connected to a source of the second P-type field effect transistor, and a drain of the second P-type field effect transistor is connected to a drain of the second N-type field effect transistor. A second output end of the PWM controller is connected to a first input end of the N-type field effect transistor driver module, a second input end of the N-type field effect transistor driver module is connected to a PGND, an output end of the N-type field effect transistor driver module is connected to a gate of the first N-type field effect transistor, a source of the first N-type field effect transistor is connected to the PGND, and a drain of the first N-type field effect transistor is connected to a source of the second N-type field effect transistor.

A first input end of the first bias module is connected to a first reference power supply, a second input end of the first bias module is connected to the PVDD, an output end of the first bias module is connected to a third input end of the P-type field effect transistor driver module and a gate of the second P-type field effect transistor, and the second input end (that is, the power source PVDD) of the first bias module is connected to the output end of the first bias module using the first voltage stabilization capacitor.

The first bias module is configured to obtain a first bias voltage based on a voltage reference input by the first reference power supply, a preset coefficient, and a power voltage of the PVDD, and output the first bias voltage.

A first input end of the second bias module is connected to a second reference power supply, a second input end of the second bias module is connected to the PGND, an output end of the second bias module is connected to a third input end of the N-type field effect transistor driver module and a gate of the second N-type field effect transistor, and the second input end of the second bias module is connected to the output end of the second bias module using the second voltage stabilization capacitor.

The second bias module is configured to obtain a second bias voltage based on a voltage reference input by the second reference power supply, the preset coefficient, and a power ground voltage of the PGND, and output the second bias voltage.

According to the power transistor bias circuit provided in the embodiments of the present disclosure, the first bias module may provide the first bias voltage for the gate of the second P-type field effect transistor and a power domain of the P-type field effect transistor driver module (that is, the third input end of the P-type field effect transistor driver module) based on the power voltage of the PVDD and the first reference power supply. The second bias module may provide the second bias voltage for the gate of the second N-type field effect transistor and a power domain of the N-type field effect transistor driver module (that is, the third input end of the N-type field effect transistor driver module) based on the power ground voltage of the PGND and the second reference power supply. That is, the first bias module and the second bias module respectively provide bias voltages for an upper transistor and a lower transistor. In this way, a switch action of a switching transistor of the upper transistor (that is, the first P-type field effect transistor) does not affect a value of a bias voltage input to a gate of the lower transistor (the second N-type field effect transistor), and a switch action of a switching transistor of the lower transistor (that is, the first N-type field effect transistor) does not affect a bias voltage input to a gate of the upper transistor (the second P-type field effect transistor). Therefore, according to this solution, impact of a switch action of a power transistor on a bias voltage of the power transistor can be reduced.

Moreover, the first voltage stabilization capacitor is connected to the PVDD and the output end of the first bias module. Therefore, impact of noise of the PVDD on a voltage difference between the first bias voltage and the power voltage of the PVDD can be reduced, thereby ensuring stability of the voltage difference between the first bias voltage and the power voltage of the PVDD. The second voltage stabilization capacitor is connected to the PGND and the output end of the second bias module. Therefore, impact of noise of the PGND on a voltage difference between the second bias voltage and the power ground voltage of the PGND can be reduced, thereby ensuring stability of the voltage difference between the second bias voltage and the power ground voltage of the PGND.

In a possible implementation, the first bias module may include a first bias control circuit and a current sink module. A first input end of the first bias control circuit is connected to the first reference power supply, a second input end of the first bias control circuit is connected to the PVDD, an output end of the first bias control circuit is connected to a first input end of the current sink module, a second input end of the current sink module is connected to the PVDD, and an output end of the current sink module is connected to the gate of the first P-type field effect transistor. The first bias control circuit is configured to obtain a reference voltage of the current sink module based on the voltage reference input by the first reference power supply, the power voltage of the PVDD, and the preset coefficient, and output the reference voltage of the current sink module to the current sink module. The current sink module is configured to receive the reference voltage of the current sink module and a charge released by the P-type field effect transistor driver module, to output the first bias voltage.

Because the current sink module can receive the charge released by the P-type field effect transistor driver module, impact of the switch actions of the upper transistors (the first P-type field effect transistor and the second P-type field effect transistor) on the bias voltage can be eliminated based on the charge released by the P-type field effect transistor driver module. The first bias voltage is obtained by processing the received reference voltage of the current sink module.

In a possible implementation, the second bias module includes a second bias control circuit and a current source module. A first input end of the second bias control circuit is connected to the second reference power supply, a second input end of the second bias control circuit is connected to the PGND, an output end of the bias control circuit is connected to a first input end of the current source module, a second input end of the current source module is connected to the PGND, and an output end of the current source module is connected to the gate of the second N-type field effect transistor. The second bias control circuit is configured to obtain a reference voltage of the current source module based on the voltage reference input by the second reference power supply, the power ground voltage of the PGND, and the preset coefficient, and output the reference voltage of the current source module to the current source module. The current source module is configured to receive the reference voltage of the current source module and output a charge to the N-type field effect transistor driver module, to output the second bias voltage.

Because the current source module can output the charge to the N-type field effect transistor driver module, impact of the switch actions of the lower transistors (the first N-type field effect transistor and the second N-type field effect transistor) on the bias voltage can be eliminated based on the charge released by the N-type field effect transistor driver module. The second bias voltage is obtained by processing the received reference voltage of the current source module.

In a possible implementation, the first bias voltage is equal to the power voltage of the PVDD minus a product of the voltage reference and the preset coefficient. The second bias voltage is equal to a sum of the power ground voltage of the PGND and the product of the voltage reference and the preset coefficient. For example, assuming that the foregoing voltage reference is VREF and the preset coefficient is CONST, the first bias voltage output by the first bias module may be VPMID=PVDD−VREF×CONST, and the second bias voltage output by the second bias module may be VNMID=PGND+VREF×CONST.

In a possible implementation, the first P-type field effect transistor, the second P-type field effect transistor, the first N-type field effect transistor, and the second N-type field effect transistor are MOS transistors.

In a possible implementation, the P-type field effect transistor driver module includes at least two cascaded phase inverters, and the N-type field effect transistor driver module includes at least two cascaded phase inverters.

DESCRIPTION OF EMBODIMENTS

Embodiments of the present disclosure provide a power transistor bias circuit. The power transistor bias circuit may be applied to a scenario in which a DCDC converter works at a high frequency, and further applied to a process of controlling a bias voltage of a stacked power transistor in the scenario in which the DCDC converter works at a high frequency.

Figure 1:
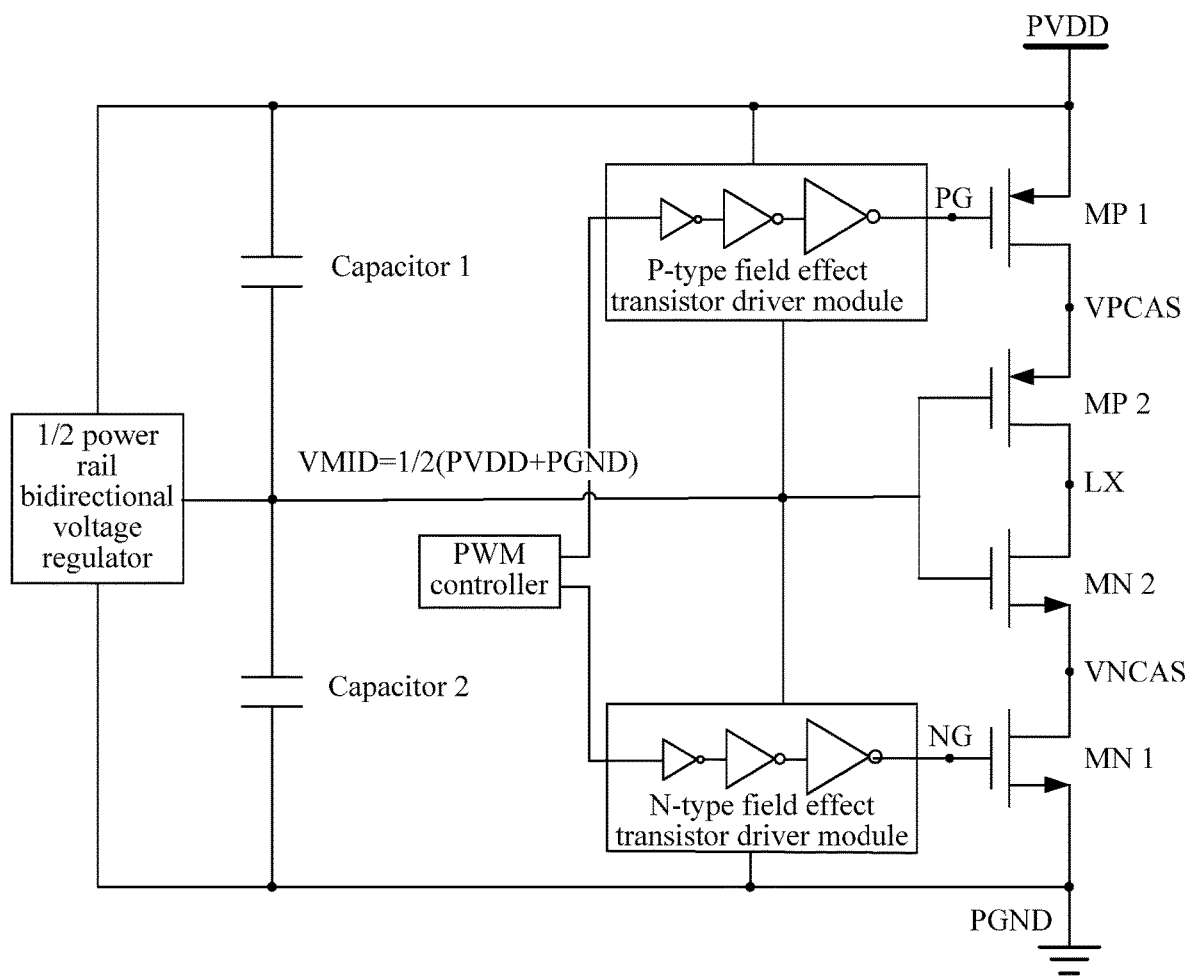
FIG. 1 is a schematic diagram of a power transistor bias circuit based on a stacked power transistor.
Figure 2:
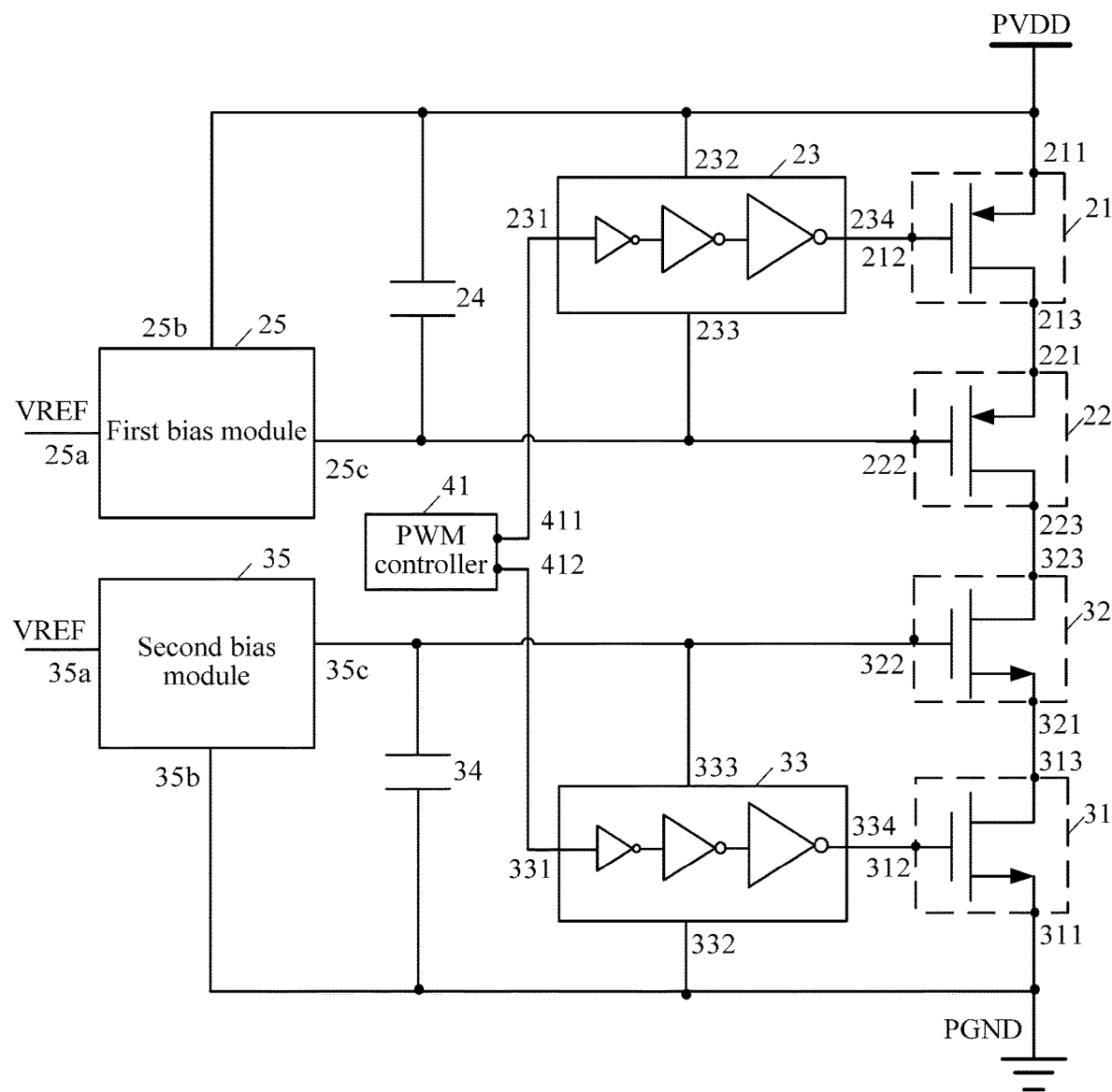
FIG. 2 is a first schematic diagram of a power transistor bias circuit according to an embodiment of the present disclosure.

Referring to FIG. 2, FIG. 2 is a schematic diagram of a power transistor bias circuit according to an embodiment of the present disclosure. As shown in FIG. 2, the power transistor bias circuit may include a first P-type field effect transistor 21, a second P-type field effect transistor 22, a P-type field effect transistor driver module 23, a first voltage stabilization capacitor 24, a first bias module 25, a first N-type field effect transistor 31, a second N-type field effect transistor 32, an N-type field effect transistor driver module 33, a second voltage stabilization capacitor 34, a second bias module 35, and a PWM controller 41.

As shown in FIG. 2, a first output end 411 of the PWM controller 41 is connected to a first input end 231 of the P-type field effect transistor driver module 23, a second input end 232 of the P-type field effect transistor driver module 23 is connected to a PVDD, an output end 234 of the P-type field effect transistor driver module 23 is connected to a gate 212 of the first P-type field effect transistor 21.

A source 211 of the first P-type field effect transistor 21 is connected to the PVDD, a drain 213 of the first P-type field effect transistor 21 is connected to a source 221 of the second P-type field effect transistor 22, and a drain 223 of the second P-type field effect transistor 22 is connected to a drain 323 of the second N-type field effect transistor 32.

As shown in FIG. 2, a second output end 412 of the PWM controller 41 is connected to a first input end 331 of the N-type field effect transistor driver module 33, a second input end 332 of the N-type field effect transistor driver module 33 is connected to a PGND, an output end 334 of the N-type field effect transistor driver module 33 is connected to a gate 312 of the first N-type field effect transistor 31, a source 311 of the first N-type field effect transistor 31 is connected to the PGND, and a drain 313 of the first N-type field effect transistor 31 is connected to a source 321 of the second N-type field effect transistor 32.

A first input end 25a of the first bias module 25 is connected to a first reference power supply, a second input end 25b of the first bias module 25 is connected to the PVDD, an output end 25c of the first bias module 25 is connected to a third input end 233 of the P-type field effect transistor driver module 23 and a gate 222 of the second P-type field effect transistor 22, and the second input end 25b of the first bias module 25 is connected to the output end 25c of the first bias module 25 using the first voltage stabilization capacitor 24.

A first input end 35a of the second bias module 35 is connected to a second reference power supply, a second input end 35b of the second bias module 35 is connected to the PGND, an output end 35c of the second bias module 35 is connected to a third input end 333 of the N-type field effect transistor driver module 33 and a gate 322 of the second N-type field effect transistor 32, and the second input end 35b of the second bias module 35 is connected to the output end 35c of the second bias module 35 using the second voltage stabilization capacitor 34.

The first bias module 25 is configured to obtain a first bias voltage based on a voltage reference (also referred to as VREF) input by the first reference power supply, a preset coefficient, and a power voltage of the PVDD, and output the first bias voltage.

The second bias module 35 is configured to obtain a second bias voltage based on a VREF input by the second reference power supply, the preset coefficient, and a power ground voltage of the PGND, and output the second bias voltage. The voltage reference input by the first reference power supply is equal to the voltage reference input by the second reference power supply.

According to the power transistor bias circuit provided in this embodiment of the present disclosure, the first bias module 25 may provide the first bias voltage for a gate of an upper transistor (the second P-type field effect transistor 22) and a power domain of the P-type field effect transistor driver module 23 (that is, the third input end 233 of the P-type field effect transistor driver module 23) based on the power voltage of the PVDD and the first reference power supply. The second bias module 35 may provide the second bias voltage for a gate of a lower transistor (the second N-type field effect transistor 32) and a power domain of the N-type field effect transistor driver module 33 (that is, the third input end 333 of the N-type field effect transistor driver module 33) based on the power ground voltage of the PGND and the second reference power supply. That is, the first bias module 25 and the second bias module 35 respectively provide bias voltages for the upper transistor and the lower transistor. In this way, a switch action of a switching transistor of the upper transistor (the first P-type field effect transistor 21) does not affect a value of a bias voltage input to a gate of the lower transistor (the second N-type field effect transistor 32), and a switch action of a switching transistor of the lower transistor (the first N-type field effect transistor 31) does not affect a value of a bias voltage input to a gate of the upper transistor (the second P-type field effect transistor 22). Therefore, according to this solution, impact of a switch action of a power transistor on a bias voltage of the power transistor can be reduced.

Moreover, the first voltage stabilization capacitor 24 is connected to the PVDD and the output end of the first bias module (that is, the output end 25c of the first bias module 25 shown in FIG. 2). Therefore, impact of noise of the PVDD on a voltage difference between the first bias voltage and the power voltage of the PVDD can be reduced, thereby ensuring stability of the voltage difference between the first bias voltage and the power voltage of the PVDD. The second voltage stabilization capacitor 34 is connected to the PGND and the output end of the second bias module (that is, the output end 35c of the second bias module 35 shown in FIG. 2). Therefore, impact of noise of the PGND on a voltage difference between the second bias voltage and the power ground voltage of the PGND can be reduced, thereby ensuring stability of the voltage difference between the second bias voltage and the power ground voltage of the PGND.

The voltage difference between the power voltage of the PVDD and the first bias voltage is equal to the voltage difference between the second bias voltage and the power ground voltage of the PGND.

For example, the first bias voltage is equal to the power voltage of the PVDD minus a product of the voltage reference and the preset coefficient. The second bias voltage is equal to a sum of the power ground voltage of the PGND and the product of the voltage reference and the preset coefficient.

For example, assuming that the foregoing voltage reference is VREF and the preset coefficient is CONST, the first bias voltage output by the first bias module 25 may be VPMID=PVDD−VREF×CONST, and the second bias voltage output by the second bias module 35 may be VNMID=PGND+VREF×CONST.

Figure 3:
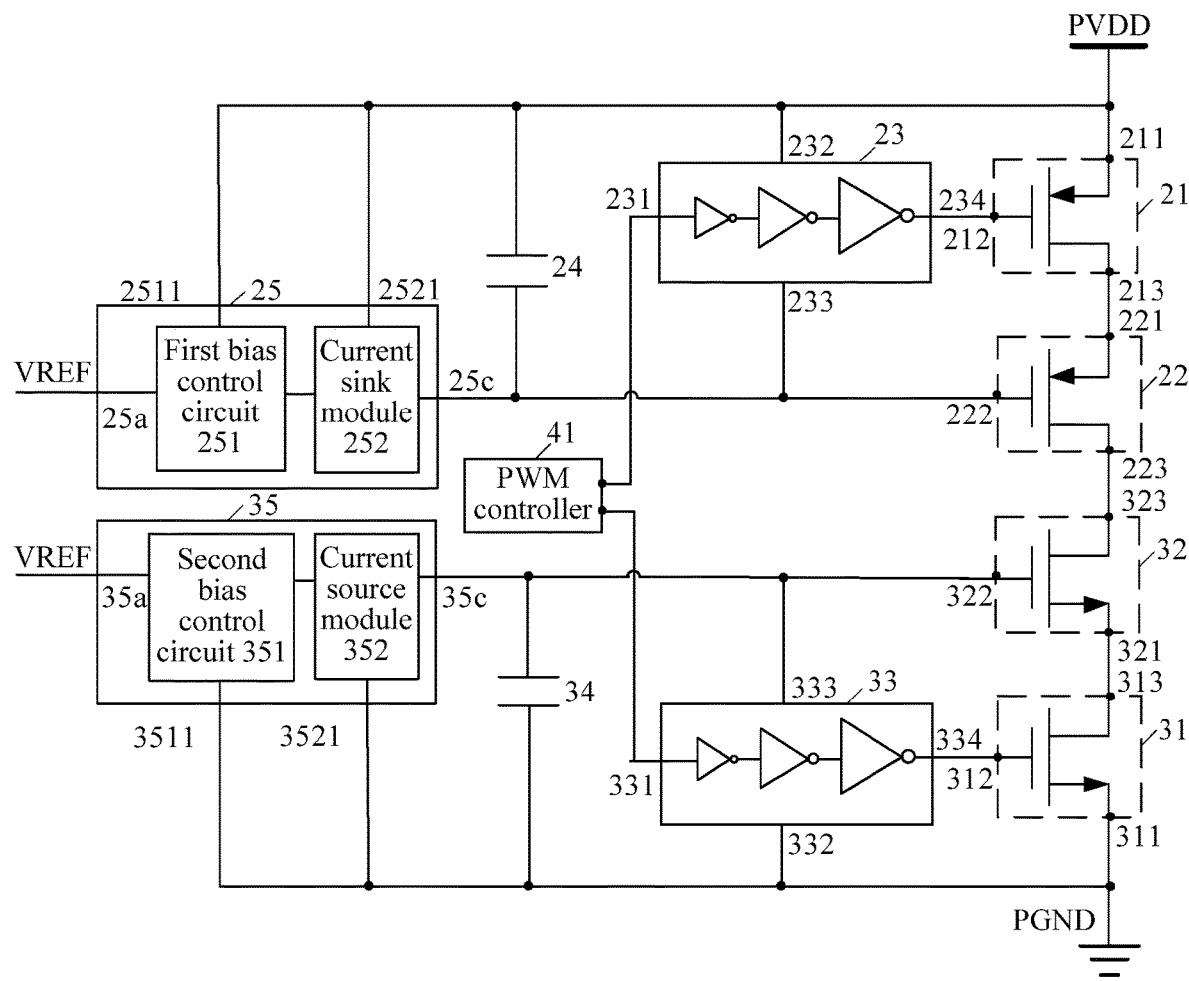
FIG. 3 is a second schematic diagram of a power transistor bias circuit according to an embodiment of the present disclosure.

Further, as shown in FIG. 3, the first bias module 25 shown in FIG. 2 may include a first bias control circuit 251 and a current sink module 252.

As shown in FIG. 3, a first input end of the first bias control circuit 251 may be the first input end 25a of the first bias module, the first input end of the first bias control circuit 251 is connected to the first reference power supply, a second input end 2511 of the first bias control circuit 251 is connected to the PVDD, an output end of the first bias control circuit 251 is connected to a first input end of the current sink module 252, a second input end 2521 of the current sink module is connected to the PVDD, and an output end of the current sink module 252 is connected to the gate 212 of the first P-type field effect transistor 21. The output end of the current sink module 252 is the output end 25c of the first bias module 25.

The first bias control circuit 251 is configured to obtain a reference voltage of the current sink module based on the voltage reference input by the first reference power supply, the power voltage of the PVDD, and the preset coefficient, and output the reference voltage of the current sink module to the current sink module.

It should be noted that a method used by the first bias control circuit 251 to obtain the reference voltage of the current sink module based on the voltage reference input by the first reference power supply, the power voltage of the PVDD, and the preset coefficient, and output the reference voltage of the current sink module to the current sink module may include that the first bias control circuit 251 obtains a first bias voltage VPMID through calculation using VPMID=PVDD−VREF×CONST based on the voltage reference VREF, the power voltage of the PVDD, and the preset coefficient (CONST).

The current sink module 252 is configured to receive the reference voltage of the current sink module and a charge released by the P-type field effect transistor driver module 23, to output the first bias voltage. Because the current sink module 252 can receive the charge released by the P-type field effect transistor driver module 23, impact on the bias voltage caused by the charge released by the P-type field effect transistor driver module 23 under the switch action of the switching transistor of the upper transistor (the first P-type field effect transistor 21) can be eliminated. The first bias voltage VPMID=PVDD−VREF×CONST is obtained by processing the received reference voltage of the current sink module.

Further, as shown in FIG. 3, the second bias module 25 shown in FIG. 2 may include a second bias control circuit 351 and a current source module 352.

As shown in FIG. 3, a first input end of the second bias control circuit 351 may be the first input end 35a of the second bias module, the first input end of the second bias control circuit 351 is connected to the second reference power supply, a second input end 3511 of the second bias control circuit 351 is connected to the PGND, an output end of the second bias control circuit 351 is connected to a first input end of the current source module 352, a second input end 3521 of the current source module 352 is connected to the PGND, and an output end of the current source module 352 is connected to the gate of the first N-type field effect transistor 31.

The second bias control circuit 351 is configured to obtain a reference voltage of the current source module based on the voltage reference input by the second reference power supply, the power ground voltage of the PGND, and the preset coefficient, and output the reference voltage of the current source module to the current source module 352.

It should be noted that a method used by the second bias control circuit 351 to obtain the reference voltage of the current source module based on the voltage reference input by the second reference power supply, the power ground voltage of the PGND, and the preset coefficient, and output the reference voltage of the current source module to the current source module 352 may include that the second bias control circuit 351 obtains a second bias voltage VNMID through calculation using VNMID=PGND+VREF×CONST based on the voltage reference VREF, the power ground voltage of the PGND, and the preset coefficient (CONST).

The current source module 352 is configured to receive the reference voltage of the current source module and output a charge to the N-type field effect transistor driver module 33, to output the second bias voltage. Because the current source module 352 can output the charge to the N-type field effect transistor driver module 33, impact on the bias voltage caused by the N-type field effect transistor driver module 33 absorbing the charge under the switch action of the switching transistor of the lower transistor (the first N-type field effect transistor 31) can be eliminated. The second bias voltage VNMID=PGND+VREF×CONST is obtained by processing the received reference voltage of the current source module.

For example, all of the first P-type field effect transistor 21, the second P-type field effect transistor 22, the first N-type field effect transistor 31, and the second N-type field effect transistor 32 may be MOS transistors.

For example, as shown in FIG. 2 or FIG. 3, the P-type field effect transistor driver module 23 may include at least two cascaded phase inverters, and the N-type field effect transistor driver module 33 may include at least two cascaded phase inverters.

Further, the voltage reference (VREF) and the preset coefficient (CONST) in the embodiments of the present disclosure may be pre-configured. That is, values of VREF and CONST may be pre-configured. In the embodiments of the present disclosure, VREF and CONST may be determined based on voltage resistance performance and working efficiency of each component in the circuit of the DC-DC converter, and may be adjusted in real time based on changes of the voltage resistance performance and the working efficiency of the component.

According to the power transistor bias circuit provided in the embodiments of the present disclosure, the first bias module 25 and the second bias module 35 respectively provide bias voltages for an upper transistor and a lower transistor. In this way, a switch action of a switching transistor of the upper transistor (the first P-type field effect transistor 21) does not affect a bias voltage input to a gate of a lower transistor (the second N-type field effect transistor 32), and a switch action of a switching transistor of the lower transistor (the first N-type field effect transistor 31) does not affect a bias voltage input to a gate of an upper transistor (the second P-type field effect transistor 22). Therefore, according to this solution, impact of a switch action of a power transistor on a bias voltage of the power transistor can be reduced.

Moreover, the first voltage stabilization capacitor 24 is connected to the PVDD and the output end of the first bias module (that is, the output end 25c of the first bias module 25 shown in FIG. 2). Therefore, impact of the noise of the PVDD on the voltage difference between the first bias voltage and the power voltage of the PVDD can be reduced, thereby ensuring stability of the voltage difference between the first bias voltage and the power voltage of the PVDD. The second voltage stabilization capacitor 35 is connected to the PGND and the output end of the second bias module (that is, the output end 35c of the second bias module 35 shown in FIG. 2). Therefore, impact of the noise of the PGND on the voltage difference between the second bias voltage and the power ground voltage of the PGND can be reduced, thereby ensuring stability of the voltage difference between the second bias voltage and the power ground voltage of the PGND.

The foregoing descriptions about implementations allow a person skilled in the art to understand that, for the purpose of convenient and brief description, division of the foregoing functional modules is taken as an example for illustration. In an actual application, the foregoing functions can be allocated to different functional modules and implemented according to a requirement. That is, an inner structure of an apparatus is divided into different functional modules to implement all or some of the functions described above. For a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the module or unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to other approaches, or all or some of the technical solutions may be implemented in the form of a software product. The software product is stored in a storage medium and includes several instructions for instructing a computer device (which may be a personal computer, a server, a network device, or the like) or a processor to perform all or some of the steps of the methods described in the embodiments of the present disclosure. The foregoing storage medium includes any medium that can store program code, such as a Universal Serial Bus (USB) flash drive, a removable hard disk, a read-only memory (ROM), a random access memory (RAM), a magnetic disk, or an optical disc.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A direct current-direct current (DC-DC) converter, comprising:
    a lower transistor, wherein a source of the lower transistor is configured to couple to a power ground (PGND);
    an upper transistor, wherein a drain of the upper transistor is configured to couple to a drain of the lower transistor, and wherein a source of the upper transistor is configured to couple to a power source (PVDD);
    a first bias circuit, wherein a first input end of the first bias circuit is configured to couple to a first voltage reference, wherein a second input end of the first bias circuit is configured to couple to the PVDD, and wherein an output end of the first bias circuit is configured to couple to a gate of the upper transistor to provide a first bias voltage for the gate of the upper transistor; and
    a second bias circuit, wherein a first input end of the second bias circuit is configured to couple to a second voltage reference, wherein a second input end of the second bias circuit is configured to couple to the PGND, and wherein an output end of the second bias circuit is configured to couple to a gate of the lower transistor to provide a second bias voltage for the gate of the lower transistor.

2. The DC-DC converter of claim 1, further comprising:
    a first switching transistor of the upper transistor, wherein a source of the first switching transistor is configured to couple to the PVDD, and wherein a drain of the first switching transistor is configured to couple to the source of the upper transistor; and
    a second switching transistor of the lower transistor, wherein a source of the second switching transistor is configured to couple to the PGND, and wherein a drain of the second switching transistor is configured to couple to the source of the lower transistor.

3. The DC-DC converter of claim 2, wherein the upper transistor and the first switching transistor are P-type field effect transistors, and wherein the lower transistor and the second switching transistor are N-type field effect transistors.

4. The DC-DC converter of claim 3, wherein the P-type field effect transistors are metal oxide semiconductor (MOS) transistors.

5. The DC-DC converter of claim 3, wherein the N-type field effect transistors are metal oxide semiconductor (MOS) transistors.

6. The DC-DC converter of claim 3, further comprising:
    a P-type field effect transistor driver circuit, wherein an output end of the P-type field effect transistor driver circuit is configured to couple to a gate of the first switching transistor; and
    an N-type field effect transistor driver circuit, wherein an output end of the N-type field effect transistor driver circuit is configured to couple to a gate of the second switching transistor.

7. The DC-DC converter of claim 6, wherein the first bias circuit comprises a first bias control circuit and a current sink circuit, wherein a first input end of the first bias control circuit is configured to couple to the first voltage reference, wherein a second input end of the first bias control circuit is configured to couple to the PVDD, wherein an output end of the first bias control circuit is configured to couple to a first input end of the current sink circuit to output the first reference voltage to the current sink circuit.

8. The DC-DC converter of claim 7, wherein a second input end of the current sink circuit is configured to couple to the PVDD, wherein an output end of the current sink circuit is configured to couple to the gate of the upper transistor, and wherein the current sink circuit is configured to:
receive the first reference voltage and a charge from the P-type field effect transistor driver circuit; and
output the first bias voltage.

9. The DC-DC converter of claim 6, wherein the second bias circuit comprises a second bias control circuit and a current source circuit, wherein a first input end of the second bias control circuit is configured to couple to the second voltage reference, wherein a second input end of the second bias control circuit is configured to couple to the PGND, and wherein an output end of the second bias control circuit is configured to couple to a first input end of the current source circuit to output the second reference voltage to the current source circuit.

10. The DC-DC converter of claim 9, wherein a second input end of the current source circuit is configured to couple to the PGND, wherein an output end of the current source circuit is configured to couple to the gate of the lower transistor, and wherein the current source circuit is configured to:
receive the second reference voltage;
output a charge to the N-type field effect transistor driver circuit; and
output the second bias voltage.

11. The DC-DC converter of claim 6, wherein the P-type field effect transistor driver circuit comprises at least two first cascaded phase inverters.

12. The DC-DC converter of claim 6, wherein the N-type field effect transistor driver circuit comprises at least two second cascaded phase inverters.

13. The DC-DC converter of claim 6, further comprising a pulse width modulation (PWM) controller, wherein a first output end of the PWM controller is configured to couple to a first input end of the P-type field effect transistor driver circuit, wherein a second input end of the P-type field effect transistor driver circuit is configured to couple to the PVDD, wherein a second output end of the PWM controller is configured to couple to a first input end of the N-type field effect transistor driver circuit, and wherein a second input end of the N-type field effect transistor driver circuit is configured to couple to the PGND.

14. The DC-DC converter of claim 13, further comprising:
a first voltage stabilization capacitor, wherein the second input end of the first bias circuit is configured to couple to the output end of the first bias circuit using the first voltage stabilization capacitor; and
a second voltage stabilization capacitor, wherein the second input end of the second bias circuit is configured to couple to the output end of the second bias circuit using the second voltage stabilization capacitor.

15. The DC-DC converter of claim 14, wherein the output end of the first bias circuit is configured to couple to a third input end of the P-type field effect transistor driver circuit.

16. The DC-DC converter of claim 14, wherein the output end of the second bias circuit is configured to couple to a third input end of the N-type field effect transistor driver circuit.

17. The DC-DC converter of claim 1, wherein the first voltage reference is equal to the second voltage reference.

18. The DC-DC converter of claim 1, wherein a voltage difference between a power voltage of the PVDD and the first bias voltage is equal to a voltage difference between the second bias voltage and a power ground voltage of the PGND.

* * * * *